(12) United States Patent
Sakai et al.

(10) Patent No.: US 7,705,966 B2
(45) Date of Patent: Apr. 27, 2010

(54) IMMERSION EXPOSURE APPARATUS

(75) Inventors: Keita Sakai, Utsunomiya (JP); Noriyasu Hasegawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 503 days.

(21) Appl. No.: 11/755,389

(22) Filed: May 30, 2007

(65) Prior Publication Data
US 2007/0291241 A1 Dec. 20, 2007

(30) Foreign Application Priority Data
Jun. 15, 2006 (JP) ............................ 2006-166197

(51) Int. Cl.
 G03B 27/42 (2006.01)
 G03B 27/52 (2006.01)
(52) U.S. Cl. .......................................... 355/53; 355/30
(58) Field of Classification Search .................... 355/53, 355/30, 72
See application file for complete search history.

(56) References Cited

U.S. PATENT DOCUMENTS
2005/0175776 A1 8/2005 Streefkerk et al.

FOREIGN PATENT DOCUMENTS
| JP | 2005-150734 | 6/2005 |
| JP | 2005-286286 | 10/2005 |
| JP | 2006-135165 A | 5/2006 |
| WO | 99/49504 | 9/1999 |

*Primary Examiner*—Peter B Kim
(74) *Attorney, Agent, or Firm*—Canon U.S.A., Inc., IP Division

(57) ABSTRACT

At least one exemplary embodiment is directed to an exposure apparatus configured to expose a substrate through a liquid comprising a projection optical and a nozzle unit. The nozzle unit has a liquid recovery port recovering the liquid and a liquid supply port arranged between a final lens and the liquid recovery port and supplying the liquid. A static contact angle of an outer-side second portion of the nozzle unit surface than the liquid recovery port with respect to the liquid is larger than that of an inner-side first portion of the nozzle unit surface than the liquid recovery port by 20° or more. A sliding angle of the second portion with respect to the liquid is 20° or less.

10 Claims, 7 Drawing Sheets

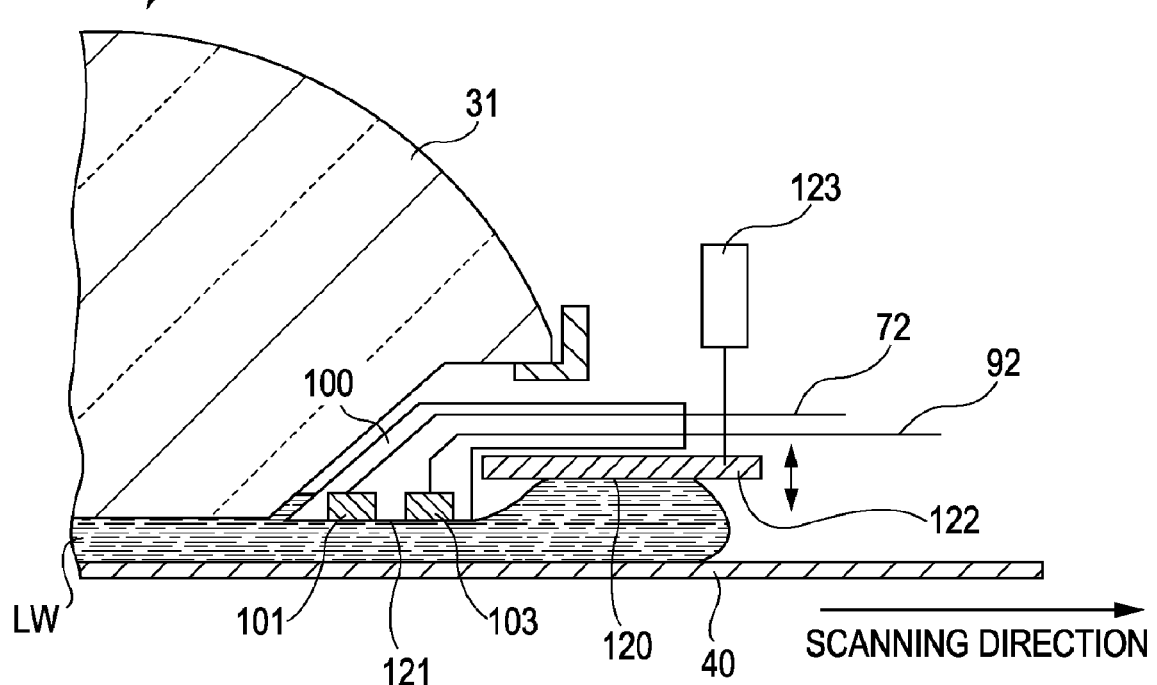
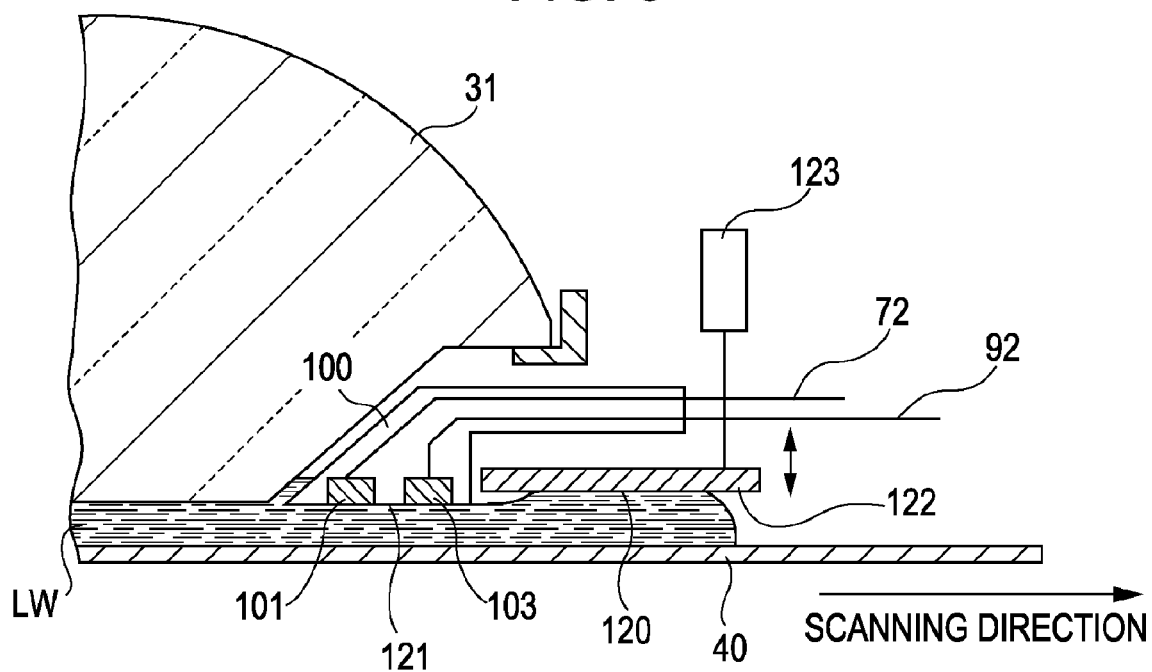

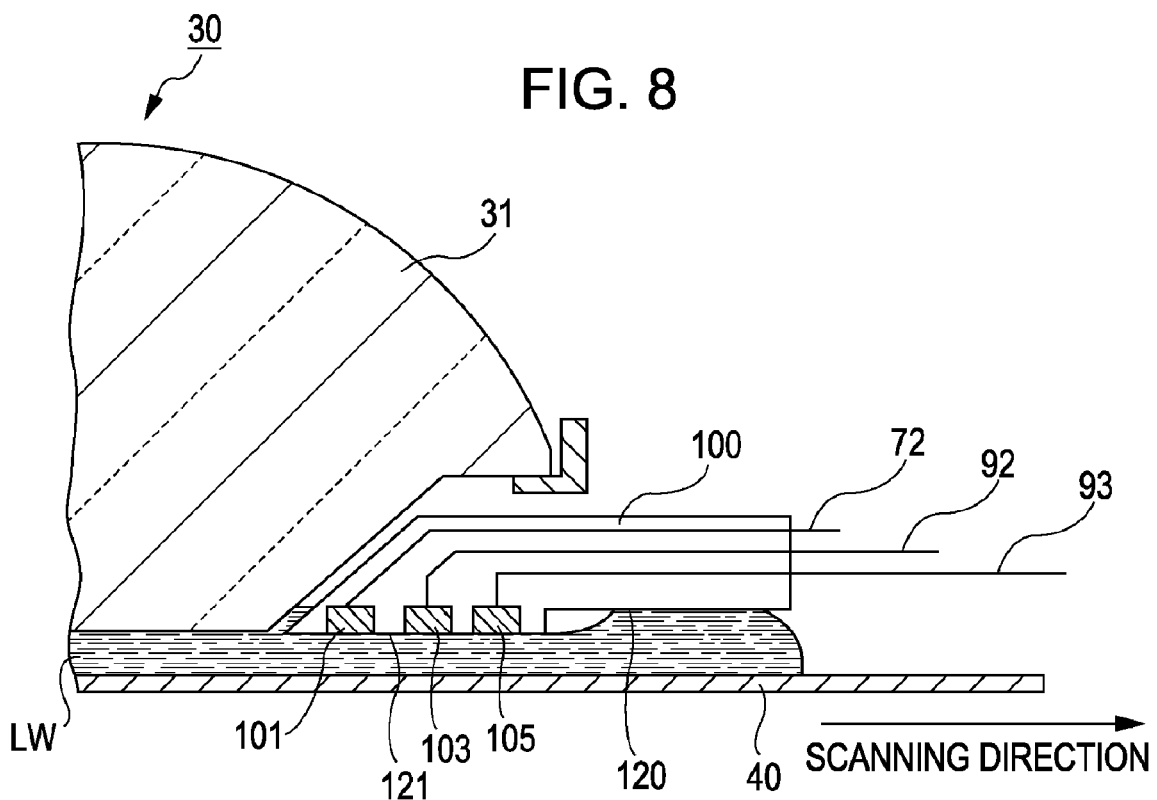
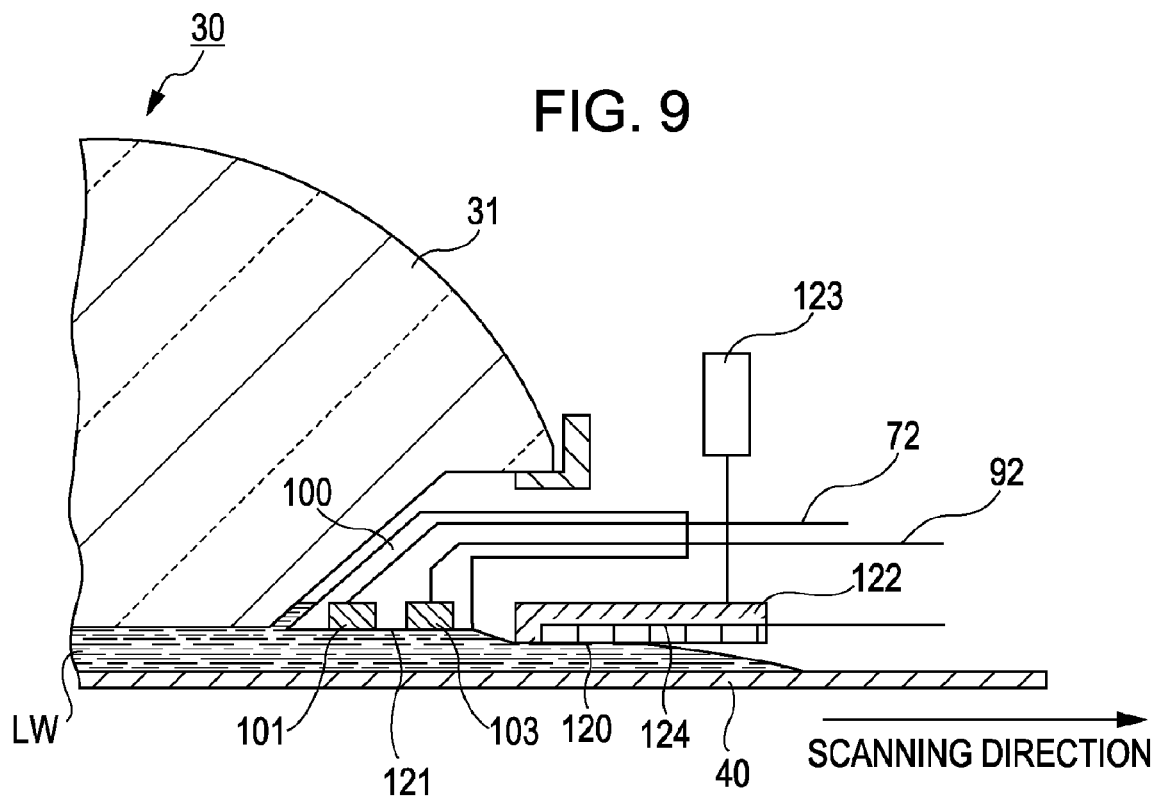

IMMERSION EXPOSURE APPARATUS

BACKGROUND OF THE INVENTION

1. Field of the Invention

The present invention relates to an immersion exposure apparatus.

2. Description of the Related Art

A projection exposure apparatus for exposing a circuit pattern drawn on a reticle (mask) onto a wafer by a projection optical system has hitherto been used. Recently, an exposure apparatus having not only a higher resolution, but also more superior transfer accuracy and throughput has been demanded with an increasing interest. In particular, attention is focused on (liquid) immersion exposure as one approach for realizing a higher resolution. The immersion exposure is intended to further increase a numerical aperture (NA) of the projection optical system by using a liquid between the projection optical system and a wafer. The NA of the projection optical system is expressed by NA=n×sin θ (where n: refractive index of the liquid). Hence the NA can be increased depending on n by filling a gap between the projection optical system and a wafer with a liquid having a higher refractive index (n>1) than air. The larger NA reduces a limit value of resolution R(R=k1×(λ/NA)) (where k1: process constant and λ: wavelength of a light source) of the exposure apparatus.

Regarding the immersion exposure, there is known a local fill method for locally filling a liquid between a wafer and a final lens of a projection optical system (see a pamphlet of International Laid-Open No. 99/49504). In the local fill method, it is required that after the wafer has been immersed in the liquid, no liquids remain on the wafer. For example, when the liquid is water, the liquid remaining on the wafer causes a defect called a water mark. The water mark is presumably caused through such a mechanism that an impurity in an atmosphere or a component of a resist is dissolved in the remaining liquid and thereafter the water is evaporated. Also, if the liquid remaining on the wafer strikes against the liquid positioned under the projection optical system, bubbles are generated in the liquid. Because the bubbles diffusely reflect an exposure light, the amount of light exposure is reduced and the throughput is lowered. Further, the diffused reflection by the bubbles prevents the exposure light from reaching the wafer, and deteriorates transfer accuracy. When the liquid is, for example, water having large evaporation heat, the heat of the wafer is deprived with the evaporation of the remaining liquid, whereupon the water temperature is locally lowered. This results in deterioration of the transfer accuracy because the wafer is deformed depending on a temperature distribution.

Various methods have been proposed to solve the above-mentioned problem by adding a hydrophobic layer and a hydrophilic layer to a liquid holding member, or by employing a liquid holding member, which is variable in relative angle with respect to the substrate (see, for example, Japanese Patent Laid-Open No. 2005-150734 and No. 2005-286286).

In the exposure apparatus proposed by Japanese Patent Laid-Open No. 2005-150734, the liquid is held in place by a sealing member fixed to the projection optical system, and a hydrophobic layer and a hydrophilic layer are formed at the bottom of the sealing member. Stated another way, a leakage of the liquid is suppressed by setting a contact angle in a portion immersed with the liquid to be relatively small and a contact angle in a portion outside the immersed portion to be relatively large. Such an arrangement is effective when a stage is operated at a low speed. However, when the stage is moved at a high speed over a long distance, the liquid is excessively dragged with the wafer, thus resulting in a risk that the liquid may contact even the layer having the large contact angle. In order to return the liquid, which has been once brought into contact with the relevant layer, to the original position in a short time, the relevant layer is required to have a high water-sliding property. More specifically, a sliding angle has to be reduced. If a static contact angle is just high, the liquid cannot be returned to the original position in a short time. Therefore, the liquid is torn and remains on the wafer. The liquid remaining on the wafer gives rise to the above-mentioned problem.

Japanese Patent Laid-Open No. 2005-286286 discusses an exposure apparatus in which a sheet-like member, for example, a sheet made of polytetrafluoroethylene (PTFE), is disposed on the outer side of a nozzle member for supplying and recovering a liquid. A pressure variation of the immersion liquid is suppressed by adjusting a relative angle of the sheet-like member to a wafer depending on a contact angle of the wafer surface. To avoid the liquid from remaining on the wafer, however, it is useful that a surface having a large contact angle be arranged parallel to the wafer surface, as described in Japanese Patent Laid-Open No. 2005-150734. This is because a contact area between the surface having a large contact angle and the liquid is increased so as to effectively suppress a length by which the liquid is extended. If the sheet-like member is not parallel to the wafer surface, the liquid is more apt to remain on the wafer than the parallel arrangement. The liquid remaining on the wafer gives rise to the above-mentioned problem.

SUMMARY OF THE INVENTION

The present invention is directed to an exposure apparatus having superior transfer accuracy and throughput.

According to one aspect of at least one exemplary embodiment of the present invention, an exposure apparatus for exposing a substrate through a liquid comprises a projection optical system arranged to project a pattern of a reticle onto the substrate, and a nozzle unit arranged around a final lens of the projection optical system. The nozzle unit has a liquid recovery port arranged to recover the liquid and a liquid supply port arranged between the final lens and the liquid recovery port and supplying the liquid, the liquid recovery port and the liquid supply port being formed in a surface of the nozzle unit which is positioned to face the substrate. A static contact angle of a second portion of the nozzle unit surface, which is positioned on an outer side than the liquid recovery port, with respect to the liquid is larger than a static contact angle of a first portion of the nozzle unit surface, which is positioned on an inner side than the liquid recovery port, with respect to the liquid by 20° or more. A sliding angle of the second portion with respect to the liquid is 20° or less.

According to another aspect of at least one exemplary embodiment of the present invention, an exposure apparatus for exposing a substrate through a liquid comprises a projection optical system arranged to project a pattern of a reticle onto the substrate, and a nozzle unit arranged around a final lens of the projection optical system. The nozzle unit has a liquid recovery port arranged to recover the liquid and a liquid supply port arranged between the final lens and the liquid recovery port and supplying the liquid, the liquid recovery port and the liquid supply port being formed in a surface of the nozzle unit which is positioned to face the substrate. The nozzle unit further comprises a main body portion including the liquid supply port and the liquid recovery port, a movable portion including a portion of the nozzle unit surface, which is positioned on an outer side than the liquid recovery port, and a driving unit configured to drive the movable portion, thereby relatively displacing the movable portion with respect to the main body portion. A surface of the movable portion positioned to face the substrate is held parallel to a surface of the substrate.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate exemplary embodiments of the invention and, together with the description, serve to explain at least some of the principles of the invention.

FIG. 4 is a schematic sectional view of a nozzle unit and the vicinity thereof according to a second exemplary embodiment.

FIG. 5 is a schematic sectional view of the nozzle unit and the vicinity thereof according to the second exemplary embodiment.

FIG. 8 is a schematic sectional view of a nozzle unit and the vicinity thereof according to a fifth exemplary embodiment.

FIG. 9 is a schematic sectional view of a nozzle unit and the vicinity thereof according to a sixth exemplary embodiment.

DESCRIPTION OF THE EMBODIMENTS

Figure 1:
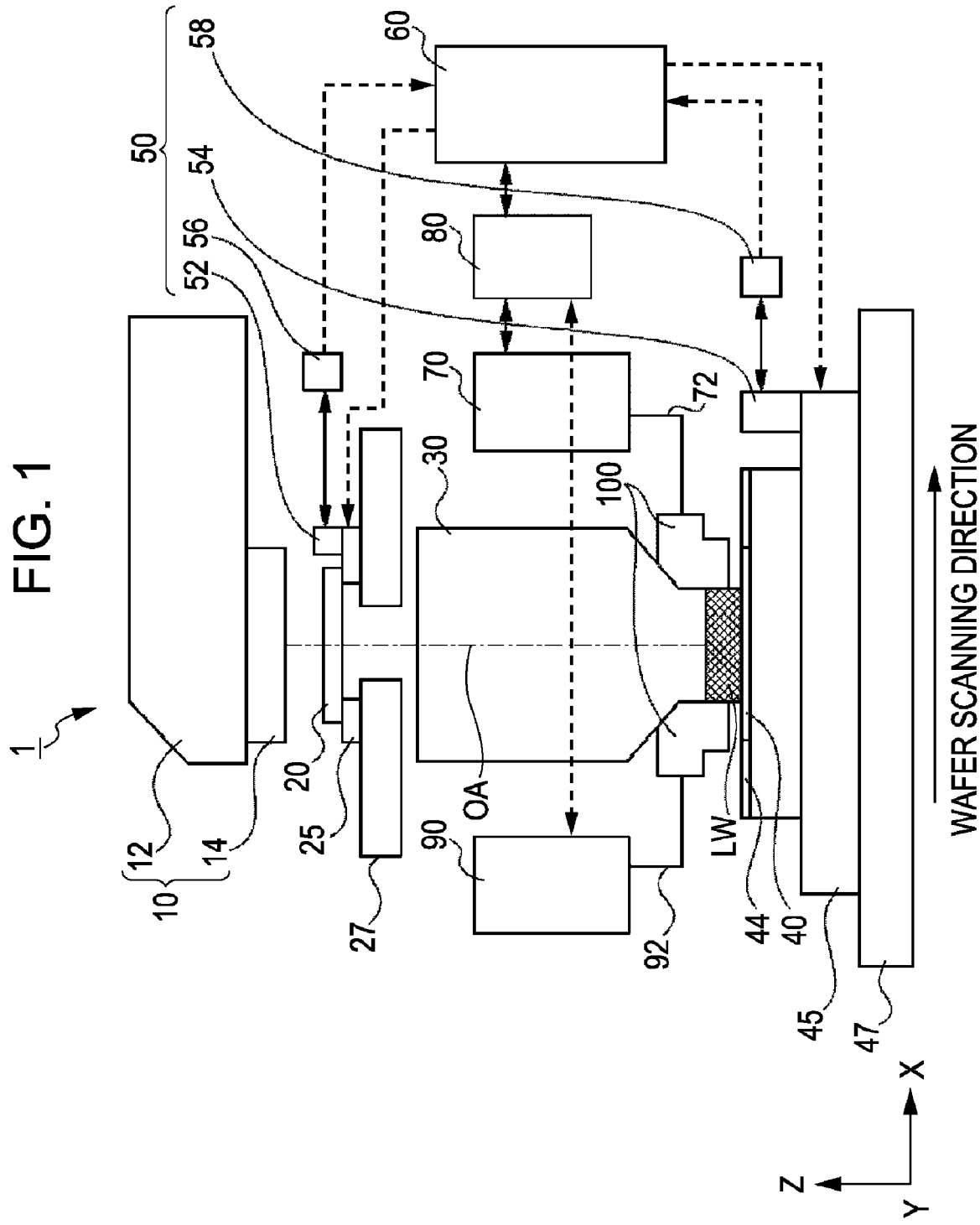
FIG. 1 is a block diagram of an exposure apparatus.

Exemplary embodiments of the present invention will be described in detail below with reference to the drawings. It is to be noted that, throughout the drawings, the same components are denoted by the same reference numerals and a duplicate description of those components is omitted.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate.

In all of the examples illustrated and discussed herein any specific values, for example contact angles, should be interpreted to be illustrative only and non limiting. Thus, other examples of the exemplary embodiments could have different values.

Note that herein when referring to correcting or corrections of an error, a reduction of the error and/or a correction of the error is intended.

First Exemplary Embodiment

FIG. 1 is a block diagram of an exposure apparatus 1 according to a first exemplary embodiment.

The exposure apparatus 1 is a (liquid) immersion exposure apparatus in which a circuit pattern formed on a reticle 20 is exposed onto a wafer 40 by a step-and-scan method through a liquid LW that is supplied to a gap between a projection optical system 30 and the wafer 40. Exemplary embodiments of the present invention can also be applied to an exposure apparatus of the step-and-repeat type.

As shown in FIG. 1, the exposure apparatus 1 includes an illumination apparatus 10, a reticle stage 25 on which is mounted the reticle 20, a projection optical system 30, a wafer stage 45 on which is mounted the wafer 40, a distance measuring device 50, a stage control unit 60, a liquid supply unit 70, an immersion control unit 80, a liquid recovery unit 90, and a nozzle unit 100.

The illumination apparatus 10 illuminates the reticle 20, which has the circuit pattern to be transferred. The illumination apparatus 10 comprises a light source unit 12 and an illumination optical system 14.

In the light source unit 12 of this first exemplary embodiment, an ArF excimer laser with a wavelength of about 193 nm is used as a light source. As an alternative light source, a KrF excimer laser with a wavelength of about 248 nm or an $F_2$ laser with a wavelength of about 157 nm can also be used as can other similar lasers as known by one of ordinary skill in the relevant art.

The illumination optical system 14 serves as an optical system for illuminating the reticle 20 by a light from the light source unit 12, and it includes a lens, a mirror, an optical integrator, and an aperture.

The reticle 20 is conveyed by a reticle conveying system (not shown) from the outside of the exposure apparatus 1 and is supported on the reticle stage 25 to be driven therewith. The reticle 20 is made of, for example, quartz and is formed on its surface with the circuit pattern to be transferred. A light coming out of the reticle 20 passes through the projection optical system 30 and is projected onto the wafer 40. The reticle 20 and the wafer 40 are arranged in an optically conjugate relation.

The reticle stage 25 is mounted to a base 27 for fixedly supporting the reticle stage 25 and supports the reticle 20 through a reticle chuck (not shown). The reticle stage 25 is moved and controlled by a moving mechanism (not shown) and the stage control unit 60. The moving mechanism (not shown) is constituted by, for example, a linear motor and is able to move the reticle 20 by driving the reticle stage 25 in the scanning direction (X-axis direction in the first exemplary embodiment).

The projection optical system 30 has the function of focusing an image of the circuit pattern on the reticle 20 onto the wafer 40. The projection optical system 30 can be constituted by, for example, a dioptric system comprising a plurality of lenses only, or a catadioptric system comprising a plurality of lenses and concave mirrors.

The wafer 40 is conveyed by a wafer conveying system (not shown) from the outside of the exposure apparatus 1 and is supported on the wafer stage 45 to be driven therewith. In this first exemplary embodiment, the wafer 40 is used as a photosensitive substrate. However, a glass plate or a liquid crystal substrate can also be used instead as can other similar substrates as known by one of ordinary skill in the arts. A photoresist is coated on the wafer 40.

A liquid holding plate (flush face plate) 44 is a plate for making the surface of the wafer 40 supported on the wafer stage 45 substantially flush with the surface of an area (of the wafer stage 45) outside the wafer 40 and for holding the liquid LW thereon. The liquid holding plate 44 is arranged around the wafer 40 and has a surface substantially at the same height as the surface of the wafer 40. Also, since the liquid holding plate 44 has the surface substantially at the same height as the surface of the wafer 40, it is able to generally hold the liquid LW (i.e., form a liquid film) even in the area outside the wafer 40 when a portion of the wafer 40 near its outer periphery is exposed to a shot.

The side of the liquid holding plate 44, which comes into contact with the liquid LW can be coated with Polytetrafluoroethylene (PTFE). Also, the side of the liquid holding plate 44 coming into contact with the liquid LW can be coated with a modified layer made of, in addition to PTFE, polyperfluoroalkoxy ethylene, a copolymer (PFA) of the former two, and/or a fluorine-based resin as a derivative thereof. The PFA material generally has a contact angle of about 100°, but the contact angle can be modified (improved), for example, by adjusting a polymerization ratio and/or by introducing a derivative or a functional group. Also, surface treatment using a silane coupling agent, for example, a silane containing a perfluoroalkyl group (such as heptadecafluorodecyl silane), can be applied to the side of the liquid holding plate 44 which comes into contact with the liquid LW.

In addition, a microstructure in the form of asperities or needles can be formed on the surface of the liquid holding plate 44 coated with the fluorine-based resin, to adjust surface roughness. Forming the microstructure (asperities) on the surface of the liquid holding plate 44 makes an easy-to-wet material easier to wet and a hard-to-wet material harder to wet. In other words, by forming the microstructure (asperities) on the surface of the liquid holding plate 44, the contact angle of the liquid holding plate 44 can be increased in appearance.

The wafer stage 45 is mounted to a base 47 for fixedly supporting the wafer stage 45 and supports the wafer 40 through a wafer chuck (not shown). The wafer stage 45 has the functions of adjusting not only the position of the wafer 40 in the up-and-down direction (vertical direction, i.e., Z-axis direction), but also the rotating direction and the inclination of the wafer 40, and it is moved and controlled by the stage control unit 60. The wafer stage 45 is controlled by the stage control unit 60 so that, in an exposure step, the surface of the wafer 40 is always aligned with the focal surface of the projection optical system 30 at high accuracy.

The distance measuring device 50 measures the position of the reticle stage 25 and the two-dimensional position of the wafer stage 45 in real time through reference mirrors 52 and 54 and laser interferometers 56 and 58, respectively. The results measured by the distance measuring device 50 are transmitted to the stage control unit 60. Based on the measured distance results, the stage control unit 60 drives the reticle stage 25 and the wafer stage 45 at a constant speed ratio for positioning and synchronous control.

The stage control unit 60 controls the driving of the reticle stage 25 and the wafer stage 45.

Figure 2:
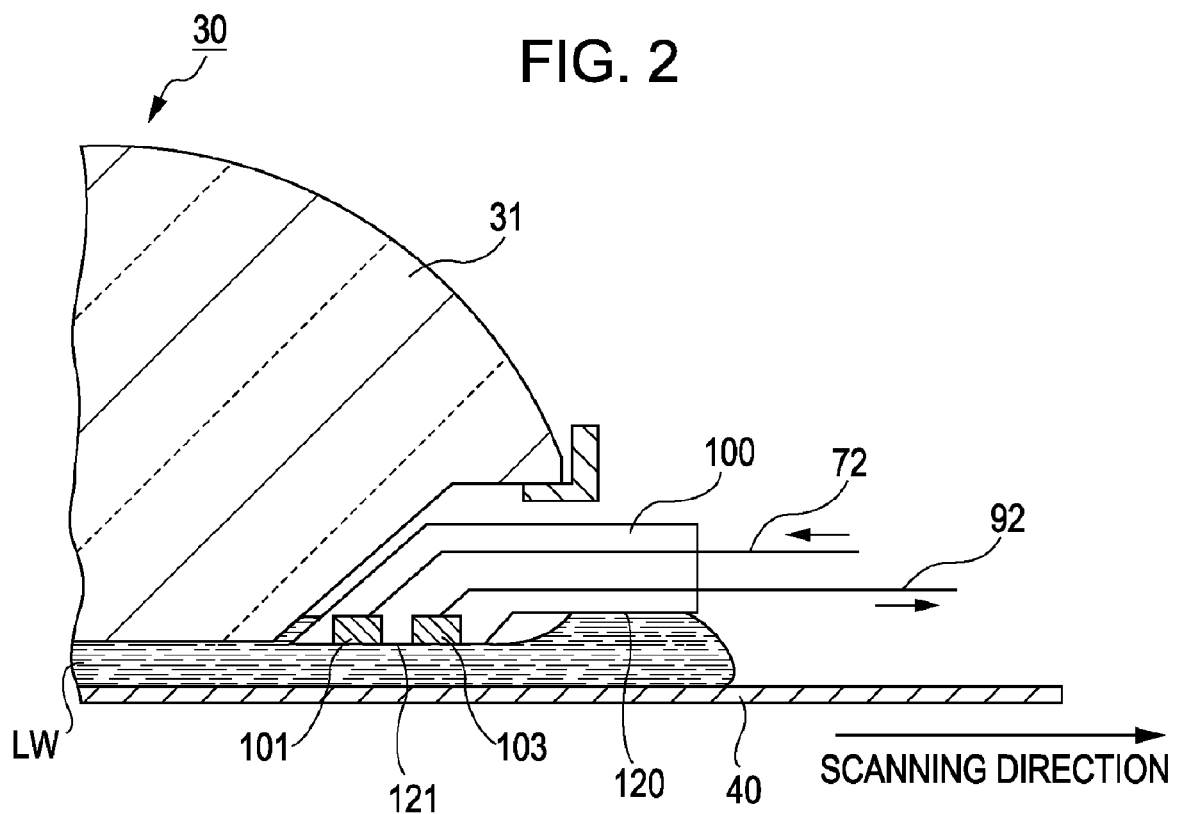
FIG. 2 is a schematic sectional view of a nozzle unit and the vicinity thereof in the exposure apparatus shown in FIG. 1.

The liquid supply unit 70 has the function of supplying, as shown in FIG. 2, the liquid LW to a space or a gap between the wafer 40 and a final lens 31 of the projection optical system 30, which is arranged closest to the wafer 40 and comes into contact with the liquid LW. In this first exemplary embodiment, the liquid supply unit 70 includes a refining apparatus, a degassing apparatus, and a temperature controller, which are not shown, as well as a liquid supply piping arrangement 72. Stated another way, the liquid supply unit 70 supplies the liquid LW to the surrounding of the final lens 31 of the projection optical system 30 through a liquid supply port 101 of the liquid supply piping arrangement 72, thereby forming a film of the liquid LW in the space between the projection optical system 30 and the wafer 40. The space between the projection optical system 30 and the wafer 40 can be set to a size, for example, of about 1.0 mm, so that the film of the liquid LW can be stably formed and removed.

The liquid supply unit 70 includes, for example, a tank for storing the liquid LW, a pressure feed apparatus for feeding the liquid LW, and a flow controller for controlling the supply flow rate of the liquid LW.

In at least one exemplary embodiment the liquid LW is selected from among materials having small absorptions of the exposure light and has a refractive index comparable to that of an optical element in the dioptric system, such as quartz or fluorite. More specifically, the liquid LW used herein is, for example, pure water, functional water, a fluoridized liquid (e.g., fluorocarbon), or higher saturated hydrocarbon. It is also useful that dissolved gases are sufficiently removed from the liquid LW in advance by using a degassing apparatus (not shown). The advanced degassing makes it possible to suppress generation of bubbles in the liquid LW and to absorb the bubbles in the liquid at once even if they are generated. For example, regarding nitrogen and oxygen contained in large amounts in air, the generation of bubbles can be sufficiently suppressed by removing 80% of the amount of those gasses dissolvable in the liquid LW. Of course, the degassing apparatus (not shown) can be incorporated in the exposure apparatus 1 so that the liquid LW is supplied to the liquid supply unit 70 while the dissolved gases in the liquid are always removed.

The refining apparatus reduces impurities, such as metal ions, fine particles, and organic substances, which are contained in a stock liquid supplied from a stock liquid supply source (not shown), thereby refining the liquid LW. The liquid LW refined by the refining apparatus is supplied to the degassing apparatus in the liquid supply unit 70.

The degassing apparatus performs a degassing process on the liquid LW to reduce oxygen and nitrogen dissolved in the liquid LW. The degassing apparatus includes, for example, by a film module and a vacuum pump. In one example of the degassing apparatus, the liquid LW is forced to flow on one side of a gas permeable film and the other side is held vacuum, thus causing the dissolved gases in the liquid LW to be purged out into the vacuum through the film.

The temperature controller has the function of controlling the temperature of the liquid LW to a predetermined value.

The liquid supply piping arrangement 72 supplies the liquid LW, which has been subjected to the degassing process and the temperature control by the degassing apparatus and the temperature controller, to the space between the projection optical system 30 and the wafer 40 through the liquid supply port 101 of the nozzle unit 100 described later. Thus, the liquid supply piping arrangement 72 is connected to the liquid supply port 101. To avoid contamination of the liquid LW, the liquid supply piping arrangement 72 can be made of a resin generating a minimum amount of eluted substances, such as a polytetrafluoroethylene (PTFE) resin, a polyethylene resin, and a polypropylene resin. When a liquid other than pure water is used as the liquid LW, the liquid supply piping arrangement 72 can be made of a material that is endurable against the liquid LW and generates a minimum amount of eluted substances into the liquid LW.

The immersion control unit 80 receives various items of information, such as the current position, speed, acceleration, target position, and the moving direction of the wafer stage 45, from the stage control unit 60, and performs control required for the immersion exposure in accordance with the received information. The immersion control unit 80 gives, to the liquid supply unit 70 and the liquid recovery unit 90, control commands for controlling switching and stop of the supply and the recovery of the liquid LW, the flow rates of the liquid LW supplied and recovered.

The liquid recovery unit 90 has the function of recovering the liquid LW supplied from the liquid supply unit 70. In this first exemplary embodiment, the liquid recovery unit 90 has a liquid recovery piping arrangement 92. The liquid recovery unit 90 comprises, for example, a tank for temporarily storing the recovered liquid LW, a suction portion for sucking the liquid LW, and a flow controller for controlling the recovery flow rate of the liquid LW.

The liquid recovery piping arrangement 92 recovers the supplied liquid LW through a liquid recovery port 103 formed in the nozzle unit 100. To avoid contamination of the liquid LW, the liquid recovery piping arrangement 92 can be made of a resin generating a minimum amount of eluted substances, such as a polytetrafluoroethylene (PTFE) resin, a polyethylene resin, and a polypropylene resin. When a liquid other than pure water is used as the liquid LW, the liquid recovery piping arrangement 92 can be made of a material that is endurable against the liquid LW and generates a minimum amount of eluted substances into the liquid LW.

The liquid supply port 101 and the liquid recovery port 103 are formed in a surface of the nozzle unit 100 which is positioned on the side closer to the wafer 40 (substrate side). The liquid supply port 101 serves as a supply port through which is supplied the liquid LW, and it is connected to the liquid supply piping arrangement 72. In this first exemplary embodiment, the liquid supply port 101 is positioned to face the wafer 40. The liquid supply port 101 is formed near the projection optical system 30 in a concentric relation. While the liquid supply port 101 is continuously formed in a concentric relation in this first exemplary embodiment, it can also be intermittently formed.

The liquid supply port 101, shown in FIG. 2, can be stuffed with a porous material, such as a sponge, or can be formed as a slit-like opening. When the porous material is used, it is, in particular, for example a porous member obtained by sintering a fibrous or granular (powdery) metal or inorganic material. Some examples of a material used for the porous member (i.e., a material forming at least the surface of the porous member) include stainless, nickel, alumina, $SiO_2$, SiC, and SiC having $SiO_2$ formed only on the surface by heat treatment.

The liquid recovery port 103 is an opening through which is recovered the supplied liquid LW, and it is connected to the liquid recovery piping arrangement 92. The liquid recovery port 103 can recover gases as well. In this first exemplary embodiment, the liquid recovery port 103 is positioned to face the wafer 40. The liquid recovery port 103 has a concentric opening. The liquid recovery port 103 can be stuffed with a porous material, such as a sponge, or can be formed as a slit-like opening. When the porous material is used, it is, in particular, for example a porous member obtained by sintering a fibrous or granular (powdery) metal or inorganic material. Some examples of a material used for the porous member (i.e., a material forming at least the surface of the porous member) include stainless, nickel, alumina, $SiO_2$, SiC, and SiC having $SiO_2$ formed only on the surface by heat treatment. As shown in FIG. 2, the liquid recovery port 103 is formed at a position on the outer side than the liquid supply port 101. In this specification, the term "outer side" refers to the side farther away from the final lens 31 of the projection optical system 30 and the term "inner side" means the side closer to the final lens 31 of the projection optical system 30. With the liquid recovery port 103 positioned on the outer side than the liquid supply port 101, the liquid LW is less apt to leak out toward a peripheral area of the projection optical system 30. While the liquid recovery port 103 is continuously formed in a concentric relation in this first exemplary embodiment, it can also be intermittently formed.

Figure 3:
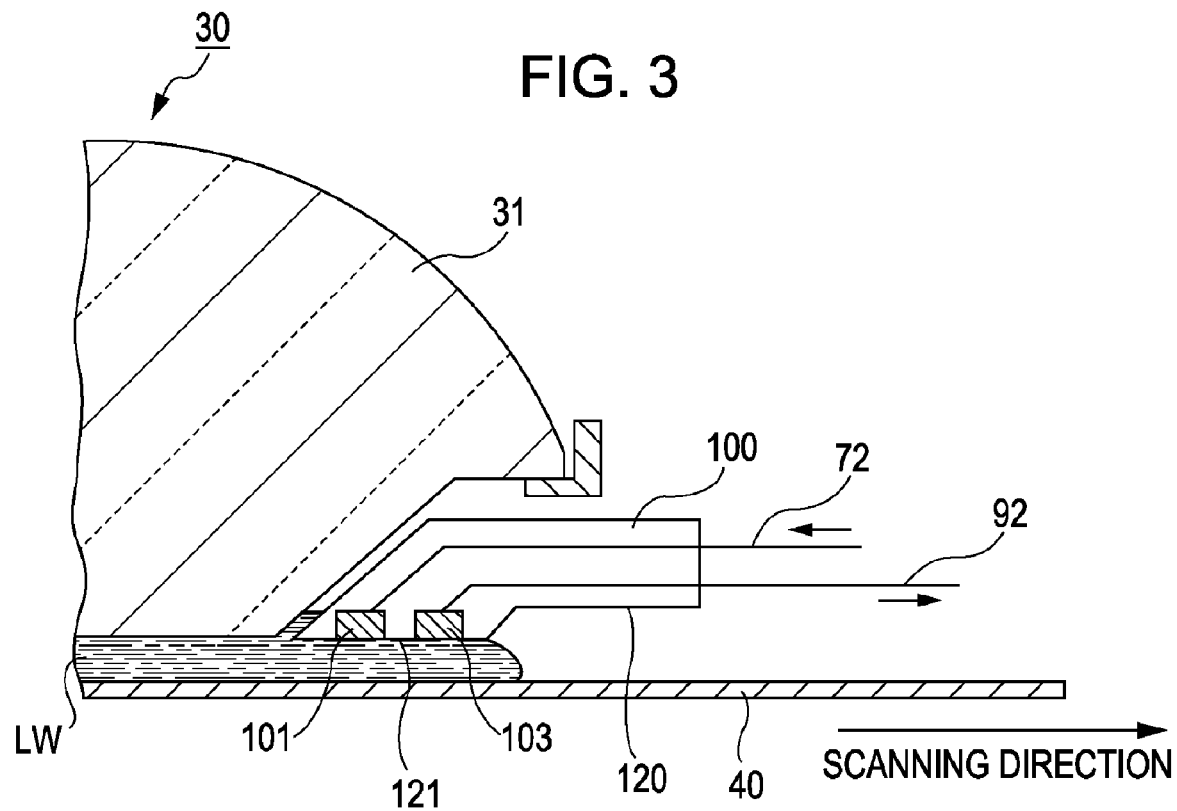
FIG. 3 is a schematic sectional view of the nozzle unit and the vicinity thereof in the exposure apparatus shown in FIG. 1.

FIGS. 2 and 3 show behaviors of the liquid LW when the liquid LW is moved together with high-speed movement of the wafer stage 45. FIGS. 2 and 3 are each a schematic sectional view of the nozzle unit 100 and the vicinity thereof in the exposure apparatus 1.

A hydrophobic surface (liquid repellent surface) 120 is formed in a part of the nozzle unit 100 on the outer side than the liquid recovery port 103 in a parallel relation to the surface of the wafer 40. A static contact angle of the hydrophobic surface (second portion) 120 with respect to the liquid LW is larger than that of a nozzle lowermost surface (first portion) 121 by 20° or more, which is positioned on the inner side than the liquid recovery port 103. Also, a sliding angle of the hydrophobic surface 120 with respect to the liquid LW is 20° or less. Herein, the static contact angle is defined as a contact angle between a substrate and a droplet when 5 μL of a liquid is dripped onto the substrate. On the other hand, the sliding angle is defined as an inclination angle of the substrate at the time when a droplet formed by dripping 50 μL of a liquid onto a substrate starts to slide on the substrate while the substrate is gradually inclined at a rate of 1°/sec. Note that the static contact angle and the sliding angle are independent indices and there is no correlation between the magnitude of the static contact angle and the magnitude of the sliding angle. For example, wax coated over a painted surface of an automobile or the like has high water repellency and its static contact angle exceeds 100°. However, the water-sliding property representing dynamic water repellency of the wax is poor and the wax has a relatively large sliding angle of about 30°. Thus, the static contact angle of the wax is large, while the sliding angle of the wax is also large. If a surface having such properties is formed as the hydrophobic surface 120, the later-described advantages cannot be obtained. For that reason, characteristics of the hydrophobic surface 120 have to be specified, taking into account the sliding angle as mentioned above.

The hydrophobic surface 120 can be coated with polytetrafluoroethylene (PTFE). The nozzle unit 100 is made of, for example, stainless, nickel, alumina, $SiO_2$, or SiC. By coating PTFE on the hydrophobic surface 120, therefore, the static contact angle of the hydrophobic surface 120 with respect to the liquid LW can be made larger than that of the nozzle lowermost surface 121 by 20° or more. Alternatively, the hydrophobic surface 120 can be coated with a modified layer made of, in addition to PTFE, polyperfluoroalkoxy ethylene, a copolymer (PFA) of the former two, and/or a fluorine-based resin as a derivative thereof.

The PFA material generally has a static contact angle of about 100° and a sliding angle of about 10°. However, the static contact angle and the sliding angle of the PFA material can be modified (improved), for example, by adjusting a polymerization ratio and/or by introducing a derivative or a functional group. Also, surface treatment using a silane coupling agent, for example, a silane containing a perfluoroalkyl group (such as heptadecafluorodecyl silane), can be applied to the hydrophobic surface 120. Surface roughness of the hydrophobic surface 120 before the application of the coating should be sufficiently small. The reason is that when the coating is applied to a surface having large surface roughness, the static contact angle is increased, but the sliding angle is simultaneously increased in many cases as compared with the case of applying the coating on a surface having small surface roughness. Such a tendency similarly occurs for the hydrophobic surface 120 having fine asperities thereon. Namely, the hydrophobic surface 120 having asperities thereon exhibits a larger static contact angle, but it also exhibits a larger sliding angle in many cases.

FIG. 2 shows the state of the nozzle unit 100 and the vicinity thereof immediately after the wafer stage 45 is moved in the X-direction at a high speed and the liquid LW is started to extend in the X-direction. When the extended liquid LW contacts the hydrophobic surface 120, the length by which the liquid LW is extended (i.e., the extension length of the liquid LW) can be reduced in comparison with the case of not forming the hydrophobic surface 120. FIG. 3 shows the state in the course of a return of the extended liquid LW toward its original position. Because the hydrophobic surface 120 has a small sliding angle, the extended liquid LW can be smoothly returned to the position of the liquid recovery port 103. If the static contact angle of the hydrophobic surface 120 is equal to that of the nozzle lowermost surface 121, the liquid LW overflows along the hydrophobic surface 120 and a part of the liquid LW remains on the wafer 40. Also, if the sliding angle of the hydrophobic surface 120 is 40° or more, the extended liquid LW cannot be smoothly returned to the liquid recovery port 103 and remains on the wafer 40.

Second Exemplary Embodiment

Another example of the nozzle unit 100 will be described below with reference to FIG. 4. FIG. 4 is a schematic sectional view of a nozzle unit 100 and the vicinity thereof according to a second exemplary embodiment. As shown in FIG. 4, the nozzle unit 100 comprises a main body portion having a liquid supply port 101 and a liquid recovery port 103 formed in its surface positioned to face the wafer, and a movable member (movable portion) 122 having a hydrophobic surface 120 formed on its surface positioned to face the wafer. A static contact angle of the hydrophobic surface 120 with respect to the liquid LW is larger than that of a nozzle lowermost surface 121 by 20° or more, which is positioned on the inner side than the liquid recovery port 103. Also, a sliding angle of the hydrophobic surface 120 with respect to the liquid LW is 20° or less. The nozzle unit 100 according to this second exemplary embodiment differs from the nozzle unit 100 shown in FIGS. 2 and 3 in that the hydrophobic surface 120 is formed on the movable member 122 separate from the main body portion of the nozzle unit 100. The movable member 122 is relatively displaceable with respect to the main body portion by a vertical driving mechanism (driving unit) 123.

FIG. 4 shows the state where a height (level) of the hydrophobic surface 120 relative to the wafer 40 is set to be high for the purpose of regulating the length by which the liquid LW is forced to extend with the high-speed movement of the wafer stage 45. On the other hand, FIG. 5 shows the state where the height of the hydrophobic surface 120 relative to the wafer 40 is set to be low for the same purpose.

The height of the hydrophobic surface 120 relative to the wafer 40 can be decided depending on the static contact angle of the surface of the wafer 40 with respect to the liquid LW. For example, the height can be decided in consideration of the moving speed of the wafer stage 45 and the distance of movement thereof as well. For example, when the static contact angle of the surface of the wafer 40 is 120°, the moving speed of the wafer stage 45 is 600 mm/sec, and the distance of movement of the wafer stage 45 is 100 mm, the height of the hydrophobic surface 120 relative to the wafer 40 can be set to 3 mm-4.5 mm. If the height of the hydrophobic surface 120 relative to the wafer 40 is set larger than 5 mm, the extended liquid LW cannot contact the hydrophobic surface 120. As a result, the extension length of the liquid LW is so increased that a part of the extended liquid LW is torn and remains on the surface of the wafer 40. If the height of the hydrophobic surface 120 relative to the wafer 40 is set smaller than 2 mm, the volume of the liquid LW receivable between the hydrophobic surface 120 and the wafer 40 per unit length is reduced and the extension length of the liquid LW is increased even at the same volume of the extended liquid LW. As a result, a part of the extended liquid LW is torn and remains on the surface of the wafer 40.

As another example, when the static contact angle of the surface of the wafer 40 is 80°, the moving speed of the wafer stage 45 is 600 mm/sec, and the distance of movement of the wafer stage 45 is 100 mm, the height of the hydrophobic surface 120 relative to the wafer 40 can be set to 1.5 mm-2.5 mm. When the static contact angle of the surface of the wafer 40 is comparatively small, the extended liquid LW has a smaller thickness. Therefore, the height of the hydrophobic surface 120 relative to the wafer 40 has to be reduced. Also, the height of the hydrophobic surface 120 relative to the wafer 40 can be set to a larger value as the moving speed of the wafer stage 45 is increased and as the distance of movement of the wafer stage 45 is increased.

By properly adjusting the height of the hydrophobic surface 120 relative to the wafer 40 depending on the static contact angle of the surface of the wafer 40 as in this second exemplary embodiment, the extension length of the liquid LW can be suppressed. Also, since the hydrophobic surface 120 has such a characteristic that the sliding angle is 20° or less, the extended liquid LW can be smoothly returned to the position below the liquid recovery port 103.

Third Exemplary Embodiment

Figure 6:
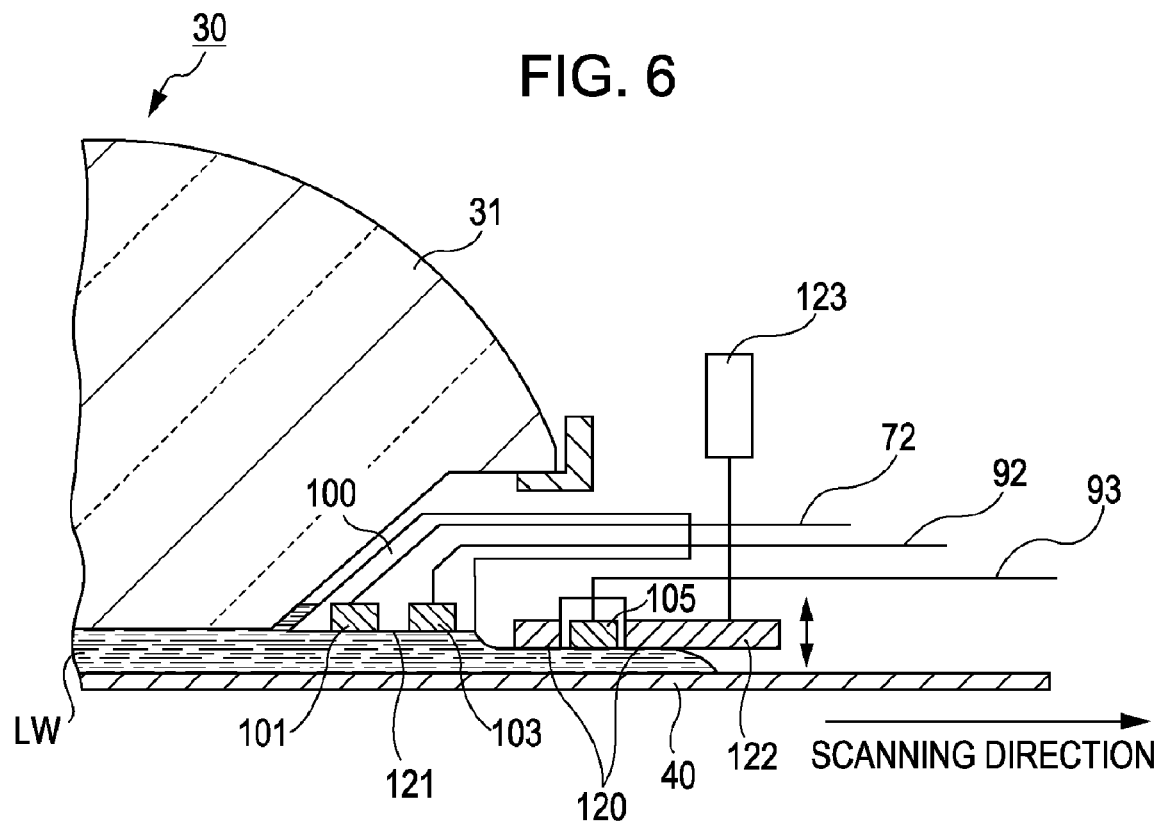
FIG. 6 is a schematic sectional view of a nozzle unit and the vicinity thereof according to a third exemplary embodiment.

Still another example of the nozzle unit 100 will be described below with reference to FIG. 6. FIG. 6 is a schematic sectional view of a nozzle unit 100 and the vicinity thereof according to a third exemplary embodiment.

This third exemplary embodiment differs from the above second exemplary embodiment in that a second recovery port 105 is formed in the movable member 122 separate from the main body portion of the nozzle unit 100. A surface of the movable member 122 positioned to face the wafer 40 is formed as a hydrophobic surface 120 except for the second recovery port 105. A static contact angle of the hydrophobic surface 120 with respect to the liquid LW is larger than that of a nozzle lowermost surface 121 by 20° or more, which is positioned on the inner side than a liquid recovery port (first liquid recovery port) 103. Also, a sliding angle of the hydrophobic surface 120 with respect to the liquid LW is 20° or less.

FIG. 6 shows the state where the second recovery port 105 and the hydrophobic surface 120 are lowered so as to contact the liquid LW for the purpose of reducing the length by which the liquid LW is forced to extend with the high-speed movement of the wafer stage 45. The height of the second recovery port 105 and the hydrophobic surface 120 relative to the wafer 40 can be decided depending on the static contact angle of the surface of the wafer 40 with respect to the liquid LW. For example, the height can be decided in consideration of the moving speed of the wafer stage 45 and the distance of movement thereof as well. For example, when the static contact angle of the surface of the wafer 40 is 120°, the moving speed of the wafer stage 45 is 600 mm/sec, and the distance of movement of the wafer stage 45 is 100 mm, the height of the second recovery port 105 and the hydrophobic surface 120 relative to the wafer 40 can be set to 3 mm-4.5 mm. If the height of the second recovery port 105 and the hydrophobic surface 120 relative to the wafer 40 is set larger than 5 mm, the extended liquid LW cannot contact the second recovery port 105 and the hydrophobic surface 120. As a result, the extension length of the liquid LW is so increased that a part of the extended liquid LW is torn and remains on the surface of the wafer 40. If the height of the second recovery port 105 and the hydrophobic surface 120 relative to the wafer 40 is set smaller than 2 mm, the volume of the liquid LW receivable between the hydrophobic surface 120, including the second recovery port 105, and the wafer 40 per unit length is reduced and the extension length of the liquid LW is increased even at the same volume of the extended liquid LW. As a result, a part of the extended liquid LW is torn and remains on the surface of the wafer 40.

As another example, when the static contact angle of the surface of the wafer 40 is 80°, the moving speed of the wafer stage 45 is 600 mm/sec, and the distance of movement of the wafer stage 45 is 100 mm, the height of the second recovery port 105 and the hydrophobic surface 120 relative to the wafer 40 can be set to 1.5 mm-2.5 mm. When the static contact angle of the surface of the wafer 40 is comparatively small, the extended liquid LW has a smaller thickness. Therefore, the height of the second recovery port 105 and the hydrophobic surface 120 relative to the wafer 40 has to be reduced. Also, the height of the second recovery port 105 and the hydrophobic surface 120 relative to the wafer 40 can be set to a larger value as the moving speed of the wafer stage 45 is increased and as the distance of movement of the wafer stage 45 is increased.

By properly adjusting the height of the second recovery port 105 and the hydrophobic surface 120 relative to the wafer 40 depending on the static contact angle of the surface of the wafer 40 as in this third exemplary embodiment, the extension length of the liquid LW can be suppressed. Also, since the hydrophobic surface 120 has such a characteristic that the sliding angle is 20° or less, a part of the extended liquid LW can be smoothly recovered through the second recovery port 105 and the other part can be returned to the position below the liquid recovery port 103.

While the second recovery port 105 and the hydrophobic surface 120 are both formed in the movable member 122 in this third exemplary embodiment, it is also possible to form only the second recovery port 105. Further, a gas ejection port for ejecting gas can be additionally formed on the outer side than the second recovery port 105.

Fourth Exemplary Embodiment

Figure 7:
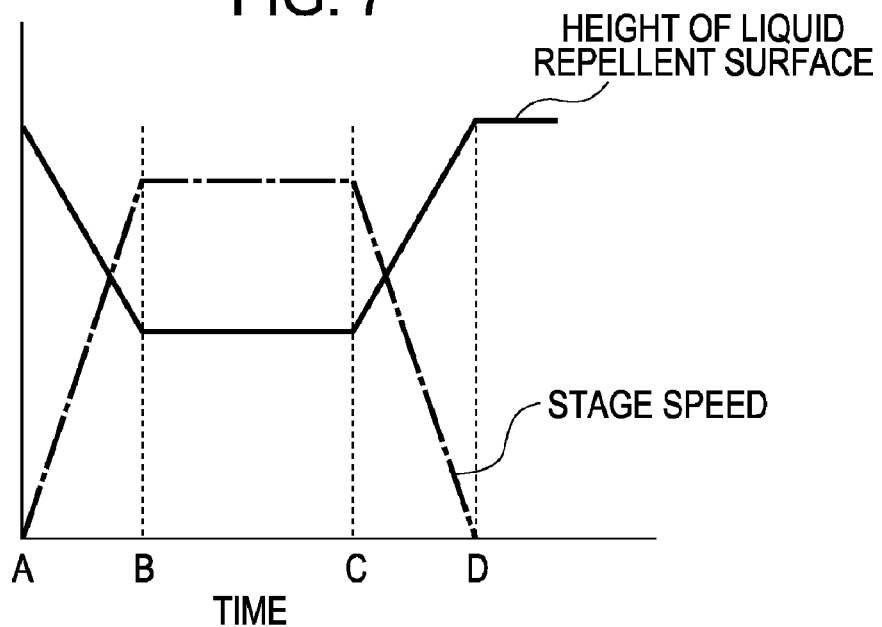
FIG. 7 is a graph showing the relationship between the speed of a wafer stage and the height of a hydrophobic surface (liquid repellent surface).

Still another example of the nozzle unit 100 will be described below with reference to FIG. 7. FIG. 7 is a graph plotting the moving speed of the wafer stage 45 and the height of the second recovery port 105 and the hydrophobic surface 120 relative to the wafer 40, shown in FIG. 6, with respect to time.

In the above third exemplary embodiment, the height of the second recovery port 105 and the hydrophobic surface 120 relative to the wafer 40 is decided depending on the static contact angle of the surface of the wafer 40 with respect to the liquid LW, and that height is finely adjusted in consideration of the moving speed of the wafer stage 45 and the distance of movement thereof. On the other hand, in this fourth exemplary embodiment, the height of the second recovery port 105 and the hydrophobic surface 120 relative to the wafer 40 is dynamically controlled in sync with the wafer stage 45. As shown in FIG. 7, the wafer stage 45 is accelerated at a constant acceleration for a period from a time A to B and is moved at a constant speed for a period from a time B to C. Thereafter, the wafer stage 45 is decelerated for a period from a time C to D and is stopped at the time D. In sync with the movement of the wafer stage 45, the height of the second recovery port 105 and the hydrophobic surface 120 relative to the wafer 40 is lowered for the period from the time A to B and is kept constant at a relatively low level for the period from the time B to C. Then, during the deceleration period from the time C to D, the height of the second recovery port 105 and the hydrophobic surface 120 relative to the wafer 40 is gradually raised so that the height is returned to an original high level at the time D. As a result of controlling the height of the movable portion of the nozzle unit 100 as described above, the liquid LW kept at a standstill at the time A is caused to extend during the period from the time A to B and to contact the second recovery port 105 and the hydrophobic surface 120, which are descended to the relatively low level. Once the liquid LW contacts the second recovery port 105 and the hydrophobic surface 120, the liquid LW is kept in contact with the second recovery port 105 and the hydrophobic surface 120 and is hard to tear for a certain period, if the period is a short time, even when the position of the second recovery port 105 and the hydrophobic surface 120 is ascended to move away from the wafer 40. By increasing the height of the second recovery port 105 and the hydrophobic surface 120 relative to the wafer 40, the volume of the space defined between the hydrophobic surface 120 including the second recovery port 105 and the wafer 40 can be increased. It is therefore possible to hold a larger amount of the extended liquid LW in the space per unit length and to reduce the extension length of the liquid LW. The relationship between the height of the second recovery port 105 and the hydrophobic surface 120 relative to the wafer 40 and the moving speed of the wafer stage 45 is not limited to that shown in FIG. 7. That relationship can be adjusted, as required, so that the liquid LW will not remain on the wafer 40. Of course, the height of the second recovery port 105 and the hydrophobic surface 120 relative to the wafer 40 can also be adjusted during a period in which the wafer 40 is scanned by the exposure light.

By controlling the height of the second recovery port 105 and the hydrophobic surface 120 relative to the wafer 40 in sync with the wafer stage 45 as in this fourth exemplary embodiment, the extension length of the liquid LW can be suppressed. Also, since the hydrophobic surface 120 has such a characteristic that the sliding angle is 20° or less, a part of the extended liquid LW can be smoothly recovered through the second recovery port 105 and the other part can be returned to the position below the liquid recovery port 103.

While the second recovery port 105 and the hydrophobic surface 120 are both formed in the movable member 122 in this fourth exemplary embodiment, one can also form only the second recovery port 105. Further, a gas ejection port for ejecting gas can be additionally formed on the outer side than the second recovery port 105.

Fifth Exemplary Embodiment

Still another example of the nozzle unit 100 will be described below with reference to FIG. 8. FIG. 8 is a schematic sectional view of a nozzle unit 100 and the vicinity thereof according to a fifth exemplary embodiment.

This fifth exemplary embodiment differs from the above exemplary embodiments in that the nozzle unit 100 has a second recovery port 105 and the hydrophobic surface 120 is formed on the outer side than the second recovery port 105 in a parallel relation to the surface of the wafer 40. A static contact angle of the hydrophobic surface 120 with respect to the liquid LW is larger than that of a nozzle lowermost surface 121 by 20° or more, which is positioned on the inner side than the second recovery port 105. Also, a sliding angle of the hydrophobic surface 120 with respect to the liquid LW is 20° or less.

FIG. 8 shows the state of the nozzle unit 100 and the vicinity thereof immediately after the wafer stage 45 is moved in the X-direction at a high speed and the liquid LW is started to extend in the X-direction. Because the extended liquid LW contacts the hydrophobic surface 120, the extension length of the liquid LW can be reduced. Also, since the hydrophobic surface 120 has such a characteristic that the sliding angle is 20° or less, the extended liquid LW can be smoothly returned to the position of the second recovery port 105. If the static contact angle of the hydrophobic surface 120 is equal to that of the nozzle lowermost surface 121, the liquid LW overflows along the hydrophobic surface 120 and a part of the liquid LW remains on the wafer 40. Also, if the sliding angle of the hydrophobic surface 120 is 40° or more, the extended liquid LW cannot be smoothly returned to the second recovery port 105 and remains on the wafer 40.

While the hydrophobic surface 120 in this fifth exemplary embodiment is not movable, the structure can be modified, as shown in FIG. 4, such that the hydrophobic surface 120 is formed on the movable member 122 and the movable member 122 is connected to the vertical driving mechanism 123.

Sixth Exemplary Embodiment

Still another example of the nozzle unit 100 will be described below with reference to FIG. 9. FIG. 9 is a schematic sectional view of a nozzle unit 100 and the vicinity thereof according to a sixth exemplary embodiment. This sixth exemplary embodiment differs from the above exemplary embodiments in that the former includes a detecting unit 124 for detecting the contact of the liquid LW with the hydrophobic surface 120.

During the processing of the wafer 40 in the exposure apparatus 1, it is difficult to observe behaviors of the liquid LW held between the nozzle unit 100 and the wafer 40. On the other hand, in the nozzle unit 100 in each of the first to fourth exemplary embodiments, the height of the hydrophobic surface 120 relative to the wafer 40 has to be adjusted depending on the static contact angle of the surface of the wafer 40, the moving speed of the wafer stage 45, and the distance of movement thereof. The height adjustment can be performed by measuring the static contact angle of the surface of the wafer 40 in advance using a contact angle meter and by inputting the measured contact angle to the exposure apparatus 1. However, because the thickness of the extended liquid LW further depends on the kind of the liquid LW, the acceleration and movement sequence of the wafer stage, in a complex relation, it is useful to provide the detecting unit 124 for detecting the contact of the liquid LW with the hydrophobic surface 120. In one example of the detecting unit 124, a liquid suction port is formed in the hydrophobic surface 120, and the contact of the liquid LW is detected from an amount of the liquid LW sucked through the liquid suction port. Alternatively, a method of detecting the contact of the liquid LW based on change of an electrical factor or change of pressure can also be used.

With the provision of the detecting unit 124 for detecting the contact of the liquid LW with the hydrophobic surface 120 as in this sixth exemplary embodiment, the height of the hydrophobic surface 120 relative to the wafer 40 can be adjusted with high accuracy. As a result, the extension length of the liquid LW can be suppressed. Also, since the hydrophobic surface 120 has such a characteristic that the sliding angle is 20° or less, the extended liquid LW can be smoothly recovered so that the liquid LW will not remain on the wafer 40.

Seventh Exemplary Embodiment

Figure 10:
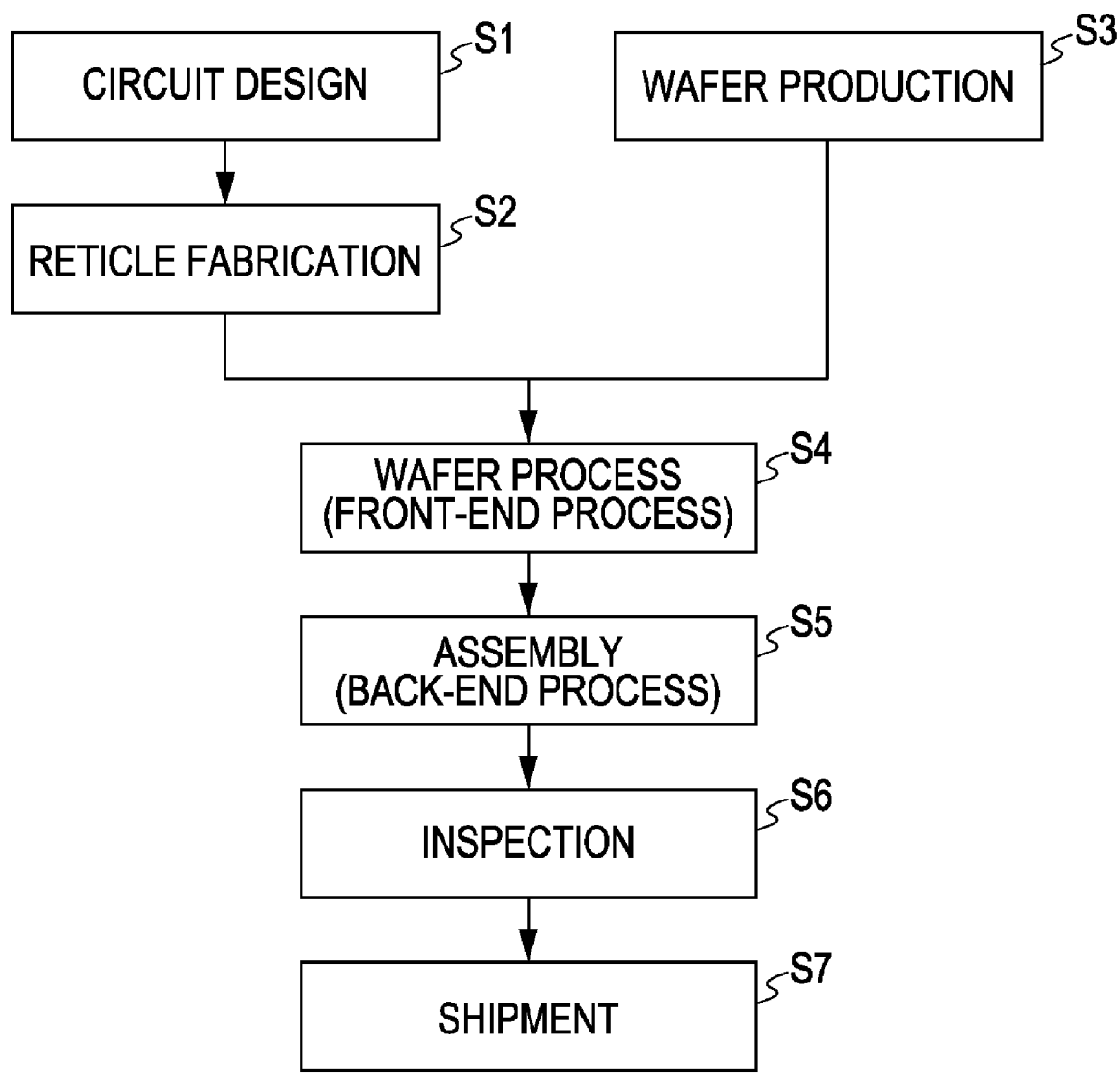
FIG. 10 is a flowchart for explaining a device manufacturing method.

An example of a method for manufacturing a device by the above-described exposure apparatus will be described below with reference to FIGS. 10 and 11. FIG. 10 is a flowchart for explaining the manufacturing of a device (such as a semiconductor device or a liquid crystal device). The following description is made, by way of example, of the manufacturing of a semiconductor device. In step 1 (circuit design), circuit design of the device is performed. In step 2 (reticle fabrication), a reticle including a designed circuit pattern formed thereon is fabricated. In step 3 (wafer manufacturing), a wafer is manufactured by using silicon or other suitable material. In step 4 (wafer process), which is also called a front-end process, an actual circuit is formed on the wafer by the lithography technique using the reticle and the wafer. In step 5 (assembly), which is also called a back-end process, a semiconductor chip is manufactured using the wafer formed in step 4. The back-end process includes an assembly step (dicing and bonding), a packaging step (chip encapsulation), and so on. In step 6 (inspection), inspection including an operation check test, a durability test is made on the semiconductor device manufactured in step 5. A semiconductor device is completed through the above-described steps and is shipped (step 7).

Figure 11:
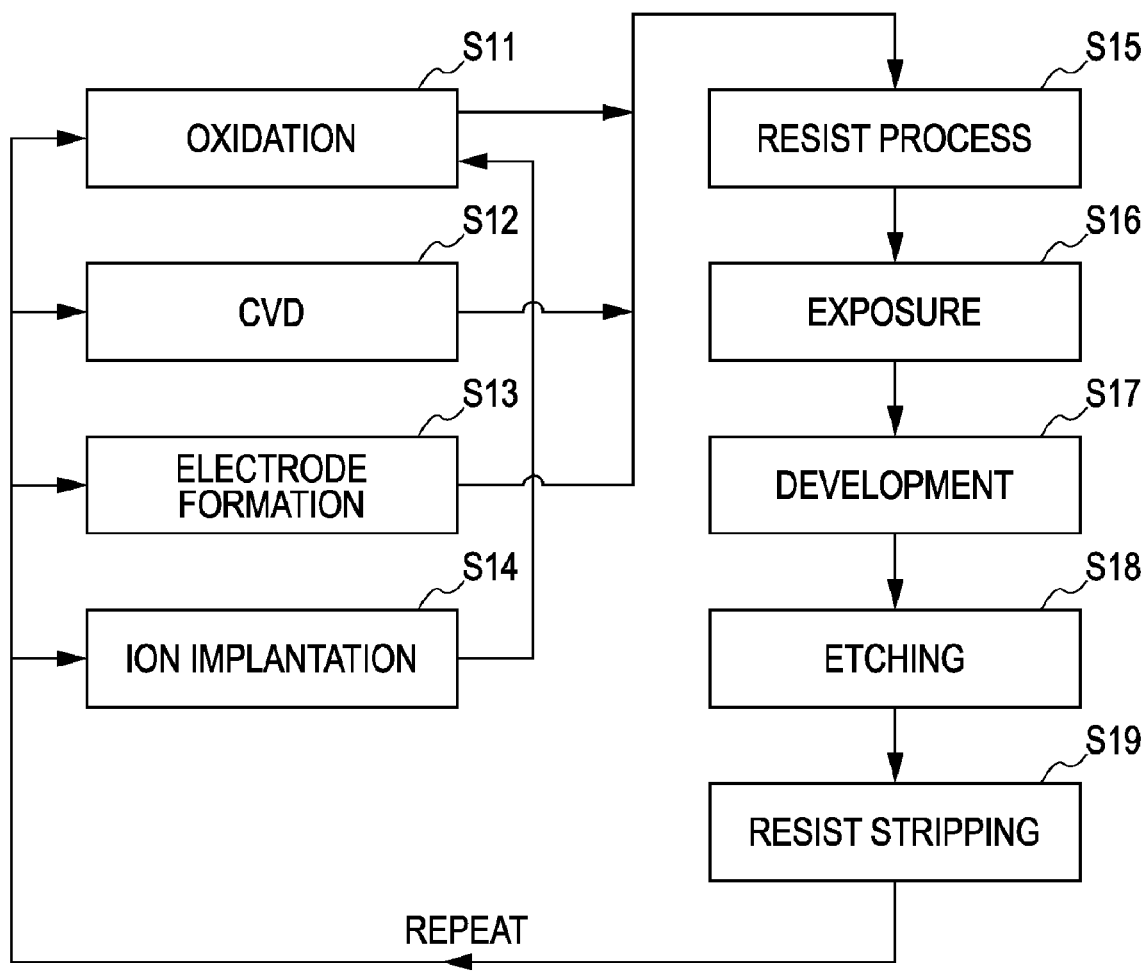
FIG. 11 is a detailed flowchart of a wafer process in FIG. 10.

FIG. 11 is a detailed flowchart of the wafer process in step 4. In step 11 (oxidation), the wafer surface is oxidized. In step 12 (CVD), an insulation film is formed on the wafer surface. In step 13 (electrode formation), electrodes are formed on the wafer by vapor deposition, for example. In step 14 (ion implantation), ions are implanted into the wafer. In step 15 (resist process), a photoresist is coated on the wafer. In step 16 (exposure), an exposure light is illuminated to the reticle for transferring the circuit pattern on the reticle to the wafer by using the exposure apparatus. In step 17 (development), the exposed wafer is developed. In step 18 (etching), the wafer is etched in area other than the developed resist image. In step 19 (resist stripping), the resist, which is not required any more after the etching is removed. By repeatedly performing the above-mentioned steps, the circuit pattern is formed on the wafer in a multiple way. With the device manufacturing method described above, a device can be manufactured with higher quality than that obtained with the known method.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Patent Application No. 2006-166197 filed Jun. 15, 2006, which is hereby incorporated by reference herein in its entirety.

What is claimed is:

1. An exposure apparatus configured to expose a substrate through a liquid, the exposure apparatus comprising:
    a projection optical system arranged to project a pattern of a reticle onto the substrate; and
    a nozzle unit arranged around a final lens of the projection optical system,
    wherein the nozzle unit has a liquid recovery port arranged to recover the liquid and a liquid supply port arranged between the final lens and the liquid recovery port and supplying the liquid, the liquid recovery port and the liquid supply port being formed in a surface of the nozzle unit which is positioned to face the substrate, a static contact angle of a second portion of the surface of the nozzle unit, which is positioned on an outer side than the liquid recovery port, with respect to the liquid, is larger than a static contact angle of a first portion of the nozzle unit surface, which is positioned on an inner side than the liquid recovery port, with respect to the liquid by 20° or more, and a sliding angle of the second portion with respect to the liquid is 20° or less.

2. The exposure apparatus according to claim 1, wherein the nozzle unit further comprises:
   a main body portion including the liquid supply port, the first portion, and the liquid recovery port;
   a movable portion including the second portion; and
   a driving unit configured to drive the movable portion, so that the second portion is relatively displaced with respect to the first portion.

3. The exposure apparatus according to claim 1, wherein the nozzle unit has, in addition to the liquid recovery port serving as a first liquid recovery port, a second liquid recovery port formed in the nozzle unit surface positioned to face the substrate, and
   the second liquid recovery port is arranged on an outer side than the first liquid recovery port.

4. The exposure apparatus according to claim 1, further comprising a detecting unit configured to detect the liquid overflowing to the outside side of the second liquid recovery port.

5. A device manufacturing method comprising the steps of:
   exposing a substrate by using an exposure apparatus according to claim 1; and
   developing the exposed substrate.

6. An exposure apparatus configured to expose a substrate through a liquid, the exposure apparatus comprising:
   a projection optical system arranged to project a pattern of a reticle onto the substrate; and
   a nozzle unit arranged around a final lens of the projection optical system,
   wherein the nozzle unit has a liquid recovery port arranged to recover the liquid and a liquid supply port arranged between the final lens and the liquid recovery port and supplying the liquid, the liquid recovery port and the liquid supply port being formed in a surface of the nozzle unit which is positioned to face the substrate,
   the nozzle unit further comprises a main body portion including the liquid supply port and the liquid recovery port, a movable portion including a portion of the surface of the nozzle unit, which is positioned on an outer side than the liquid recovery port, and a driving unit configured to drive the movable portion, thereby relatively displacing the movable portion with respect to the main body portion, and
   a surface of the movable portion positioned to face the substrate is held parallel to a surface of the substrate.

7. The exposure apparatus according to claim 6, further comprising a control unit configured to drive the movable portion depending on the static contact angle of the substrate surface, thereby adjusting a height of the movable portion relative to the substrate.

8. The exposure apparatus according to claim 7, wherein the control unit drives the movable portion during a period in which the substrate is scanned, thereby adjusting the height of the movable portion relative to the substrate.

9. The exposure apparatus according to claim 8, wherein the control unit drives the movable portion in sync with a stage holding the substrate, thereby adjusting the height of the movable portion relative to the substrate.

10. A device manufacturing method comprising the steps of:
    exposing a substrate by using an exposure apparatus according to claim 6; and
    developing the exposed substrate.

* * * * *